US009853033B2

(12) United States Patent
Liaw

(10) Patent No.: US 9,853,033 B2
(45) Date of Patent: Dec. 26, 2017

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Zhudong Township (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 14/335,659

(22) Filed: Jul. 18, 2014

(65) Prior Publication Data
US 2015/0318290 A1 Nov. 5, 2015

Related U.S. Application Data

(60) Provisional application No. 61/986,647, filed on Apr. 30, 2014.

(51) Int. Cl.
H01L 27/11 (2006.01)
H01L 29/78 (2006.01)
H01L 21/8238 (2006.01)
H01L 29/423 (2006.01)
H01L 27/02 (2006.01)

(52) U.S. Cl.
CPC .. H01L 27/1104 (2013.01); H01L 21/823807 (2013.01); H01L 21/823814 (2013.01); H01L 21/823857 (2013.01); H01L 21/823871 (2013.01); H01L 21/823878 (2013.01); H01L 21/823885 (2013.01); H01L 27/0207 (2013.01); H01L 27/1116 (2013.01); H01L 29/42356 (2013.01); H01L 29/7827 (2013.01)

(58) Field of Classification Search
CPC ............ H01L 27/1104; H01L 29/7827; H01L 29/42356; H01L 21/823885
See application file for complete search history.

(56) References Cited

U.S. PATENT DOCUMENTS

| 5,994,735 | A  | * | 11/1999 | Maeda   | H01L 27/092 257/302    |
|-----------|----|---|---------|---------|------------------------|
| 7,236,396 | B2 | * | 6/2007  | Houston | G11C 11/412 257/E21.661|
| 7,522,445 | B2 | * | 4/2009  | Inaba   | G11C 11/412 365/104    |
| 8,154,086 | B2 | * | 4/2012  | Masuoka | H01L 21/84 257/380     |
| 8,692,317 | B2 | * | 4/2014  | Takeuchi| H01L 27/0207 257/329   |
| 8,969,949 | B2 | * | 3/2015  | Chuang  | H01L 27/11 257/220     |
| 2007/0189060 | A1 | | 8/2007 | Inaba   |                        |
| 2011/0018056 | A1 | * | 1/2011 | Takeuchi| H01L 21/76895 257/329  |

(Continued)

Primary Examiner — Allison P Bernstein
(74) Attorney, Agent, or Firm — Maschoff Brennan

(57) ABSTRACT

A memory device includes an array of memory cells. At least one of the memory cells includes a plurality of transistors with vertical-gate-all-around configurations and a plurality of active blocks. A portion of one of the active blocks serves as a source or a drain of one of the transistors. The active blocks in any adjacent two of the memory cells are isolated from each other.

20 Claims, 14 Drawing Sheets

(56) References Cited

U.S. PATENT DOCUMENTS

| | | |
|---|---|---|
| 2011/0024828 A1 | 2/2011 | Takeuchi |
| 2014/0151811 A1 | 6/2014 | Liaw |
| 2015/0179655 A1* | 6/2015 | Nakanishi ........... H01L 51/0575 257/9 |
| 2015/0318289 A1* | 11/2015 | Liaw ................... H01L 27/1104 257/329 |

* cited by examiner

MEMORY DEVICE AND MANUFACTURING METHOD THEREOF

RELATED APPLICATIONS

This application claims priority to U.S. Provisional Application Ser. No. 61/986,647, filed Apr. 30, 2014, which is herein incorporated by reference.

BACKGROUND

Static Random Access Memory (Static RAM or SRAM) is a semiconductor memory that retains data in a static form as long as the memory has power. SRAM is faster and more reliable than the more common dynamic RAM (DRAM). The term static is derived from the fact that it doesn't need to be refreshed like DRAM. SRAM is used for a computer's cache memory and as part of the random access memory digital-to-analog converter on a video card.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
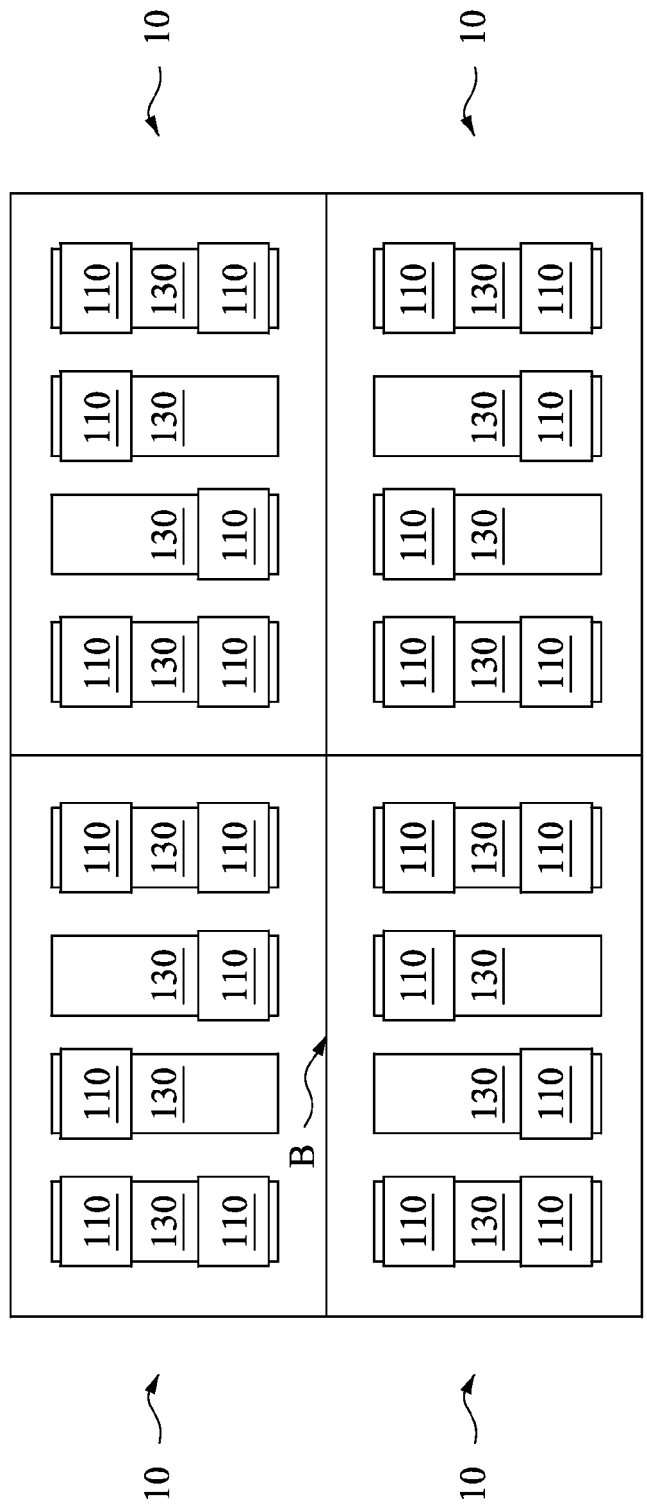
FIG. 1 is a plane view of a memory device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a plane view of a memory device in accordance with various embodiments of the present disclosure. As shown in FIG. 1, the memory device includes an array of memory cells 10. At least one of the memory cells 10 includes a plurality of transistors 110 with vertical-gate-all-around (VGAA) configurations and a plurality of active blocks 130. A portion of one of the active blocks 130 serves as a source or a drain of one of the transistors 110. The active blocks 130 in any adjacent two of the memory cells 10 are isolated from each other. In other words, the active blocks 130 in one of the memory cells 10 are distant from boundaries B of the memory cell 10.

In various embodiment of the present disclosure, the transistors 110 of the memory cells 10 are vertical-gate-all-around (VGAA) configurations, which provide high integration densities. The gate of the (VGAA) transistors 110 surrounds its channel region on all sides, thereby improving its ability to control the flow of current and exhibiting good short channel control. The (VGAA) transistors 110 also provide advantages including gate controllability, low leakage, high on-off ratio, and enhanced carrier transport property. In addition, portions of the active blocks 130 respectively serve as the sources or drains of the transistors 110, and since the active blocks 130 in any adjacent two of the memory cells 10 are isolated from each other, the active blocks 130 can be connection structures between the transistors 110 in the same memory cells 10. Therefore, other contacts that connecting the transistors 110 can be reduced or omitted, resulting in a dense integration layout.

Figure 2A:
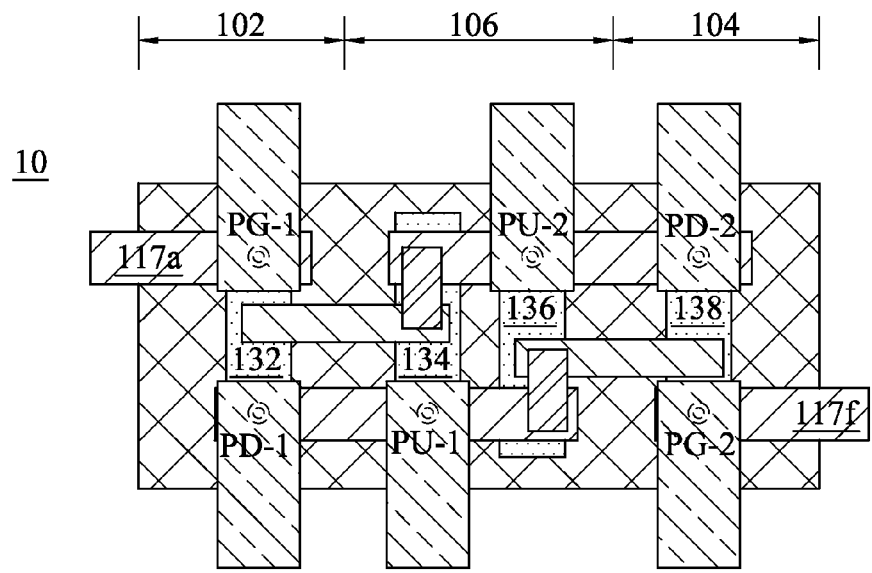
FIG. 2A is a plane view of one of memory cells of FIG. 1 in accordance with various embodiments.
Figure 2B:
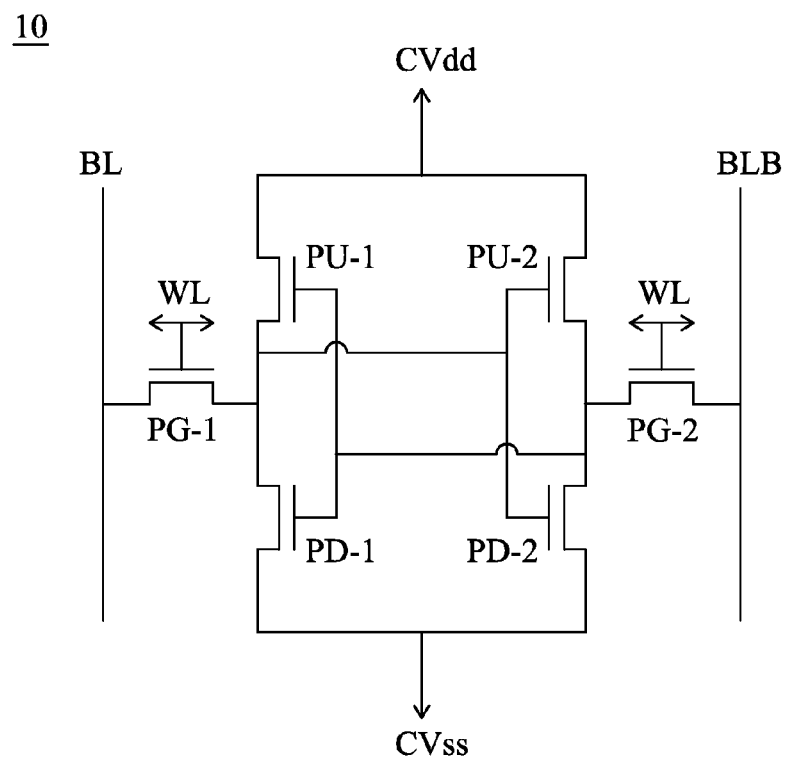
FIG. 2B is a circuit diagram of the memory cell of FIG. 2A.

FIG. 2A is a plane view of one of the memory cells 10 of FIG. 1 in accordance with various embodiments, and FIG. 2B is a circuit diagram of the memory cell 10 of FIG. 2A. For the sake of clarity, the word line WL, the first bit line BL, the second bit line BLB, and the power supply conductors CVdd, CVss of the memory cell 10 are depicted in the circuit diagram and not in the plane view. In FIGS. 2A and 2B, the memory cell 10 is a six-transistor (6T) static random access memory (SRAM), and is an N-type pass gate device. That is, the memory cell 10 includes a first transistor PG-1 (also named a first pass-gate transistor), a second transistor PD-1 (also named a first pull-down transistor), a third transistor PU-1 (also named a first pull-up transistor), a fourth transistor PU-2 (also named a second pull-up transistor), a fifth transistor PD-2 (also named a second pull-down transistor), and a sixth transistor PG-2 (also named a second pass-gate transistor). Moreover, the memory cell 10 further includes a first active block 132, a second active block 134, a third active block 136, and a fourth active block 138. A portion of the first active block 132 is a drain of the first transistor PG-1, another portion of the first active block 132 is a drain of the second transistor PD-1, a portion of the second active block 134 is a drain of the third transistor PU-1, a portion of the third active block 136 is a drain of the fourth transistor PU-2, a portion of the fourth active block 138 is a drain of the fifth transistor PD-2, and another portion of the fourth active block 138 is a drain of the sixth transistor PG-2. That is, the first active block 132 further serves as a connection structure between the first transistor PG-1 and the second transistor PD-1, and the fourth active block 138 further serves as a connection structure between the fifth transistor PD-2 and the sixth transistor PG-2.

In FIG. 2A, the memory cell 10 further includes two first wells 102, 104 and a second well 106 disposed between the two first wells 102 and 104. Dopants of the first wells 102, 104 are different from dopants of the second well 106. For the N-type pass gate device as shown in FIGS. 2A and 2B, the first wells 102, 104 are P-type wells, and the second well 106 is an N-type well. The first transistor PG-1 and the second transistor PD-1 are disposed on the first well 102, the third transistor PU-1 and the fourth transistor PU-2 are disposed on the second well 106, and the fifth transistor PD-2 and the sixth transistor PG-2 are disposed on the first well 104.

In particular, the structure of the memory cell 10 in FIGS. 2A and 2B is described in the context of the 6T-SRAM. One of ordinary skill in the art, however, should understand that features of the various embodiments described herein may be used for forming other types of devices, such as an 8T-SRAM memory device, or memory devices other than SRAMs. Furthermore, embodiments of the present disclosure may be used as stand-alone memory devices, memory devices integrated with other integrated circuitry, or the like. Accordingly, the embodiments discussed herein are illustrative of specific ways to make and use the disclosure, and do not limit the scope of the disclosure.

Figure 3:
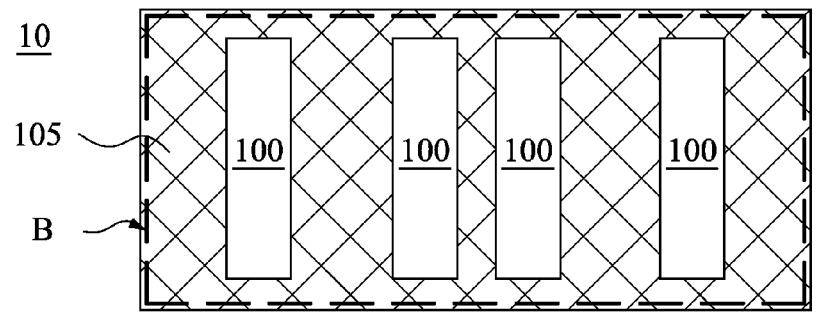
FIGS. 3~11 are plane views of a method for manufacturing the memory cell of FIG. 2A in accordance with various embodiments of the present disclosure.

The following paragraphs provide detailed explanations with respect to how to manufacture the memory cell 10 of FIG. 2A. FIGS. 3~11 are plane views of a method for manufacturing the memory cell 10 of FIG. 2A in accordance with various embodiments of the present disclosure, and FIG. 12 is a cross-sectional view taken along line 12-12 of FIG. 11. Reference is made to FIGS. 3 and 12. An isolation structure 105 is formed in a substrate 100 to define a layout area of the memory cell 10, which is an area looped by the boundaries B. That is, the isolation structure 105 is formed at the boundaries B of the memory cell 10. In addition, the isolation structure 105 also exposes portions of the substrate 100 to define the layout area of active blocks.

The isolation structure 105 may be a shallow trench isolation (STI), which may be made from undoped silicate glass (USG). The STI features may be manufactured using a process sequence such as: growing a pad oxide, forming a low pressure chemical vapor deposition (LPCVD) nitride layer, patterning an STI opening using photoresist and masking, etching a trench in the substrate 100, optionally growing a thermal oxide trench liner to improve the trench interface, filling the trench with CVD oxide, using chemical mechanical planarization (CMP) to etch back, and using nitride stripping to leave the STI structure. Other isolation techniques, such as field oxide, can also be used. The substrate 100 may include monocrystalline silicon. In other embodiments, the substrate 100 may be made from silicon germanium, strained silicon, silicon on insulator, or composite silicon content. The substrate 100 can be a bulk-substrate or a non-bulk substrate.

Figure 4:
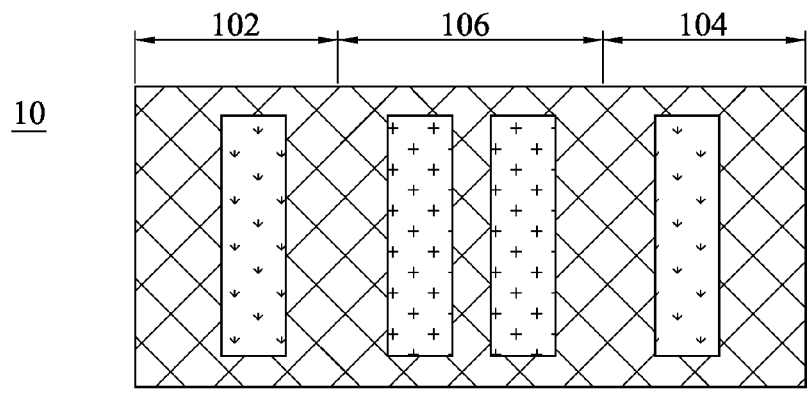

Reference is made to FIGS. 4 and 12. Two first wells 102 and 104 and a second well 106 are formed in the substrate 100. The first wells 102 and 104 are P-type wells, and the second well 106 is an N-type well. In various embodiments, the first wells 102 and 104 and the second well 106 are formed using masking and ion implantation technology.

Figure 5:
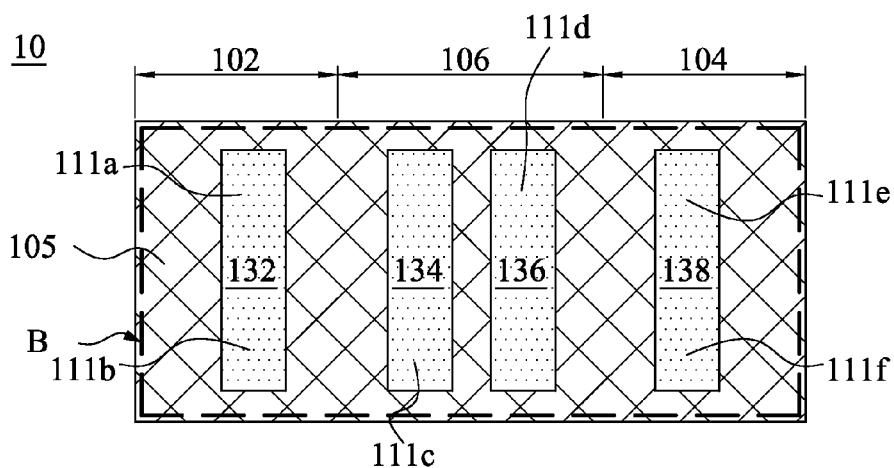

Reference is made to FIGS. 5 and 12. A plurality of active blocks (i.e., a first active block 132, a second active block 134, a third active block 136, and a fourth active block 138) are formed on the first wells 102 and 104 and the second well 106 and isolated by the isolation structure 105. In greater detail, the first active block 132 is formed on the first wells 102, the second active block 134 and the third active block 136 are formed on the second well 106, and the fourth active block 138 is formed on the first well 104. In this way, the first active block 132, the second active block 134, the third active block 136, and the fourth active block 138 are confined inside the isolation structure 105 and are distant from the boundaries B. Two portions of the first active block 132 respectively serve as bottom electrodes 111a, 111b (i.e. the drains) of the first transistor PG-1 and the second transistor PD-1 (see FIG. 11), a portion of the second active block 134 serves as a bottom electrode 111c (i.e. the drain) of the third transistor PU-1 (see FIG. 11), a portion of the third active block 136 serves as a bottom electrode 111d (i.e. the drain) of the fourth transistor PU-2 (see FIG. 11), and two portions of the fourth active block 138 respectively serve as bottom electrodes 111e, 111f (i.e. the drains) of the fifth transistor PD-2 and the sixth transistor PG-2 (see FIG. 11).

The first active block 132, the second active block 134, the third active block 136, and the fourth active block 138 may be formed using masking and ion implantation technology. The active blocks 132 and 138 may be made from SiP, SiC, SiPC, Si, Ge, III-V materials, or any combination thereof. The first active block 132 and the fourth active block 138 may be performed an n-doping process with dopants including P, As, Sb, N, C, or any combination thereof. The second active block 134 and the third active block 136 may be made from SiGe, Ge, SiP, SiC, III-V materials, or any combination thereof. The second active block 134 and the third active block 136 may be performed a p-doping process with dopants including B11, BF2, In, N, C, or any combination thereof. The III-V materials include InP, InAs, GaAs, AlInAs, InGaP, InGaAs, GaAsSb, GaPN, AlPN, or any combination thereof.

In some embodiments, a silicide layer 140 can be formed on the first active block 132, the second active block 134, the third active block 136, and the fourth active block 138. The silicide layer 140 may be made from Ti, Co, Ni, Mo, Pt, or any combination thereof. For the sake of clarity, the silicide layer 140 is depicted in the cross-sectional view and is omitted in the plane view.

Figure 6:
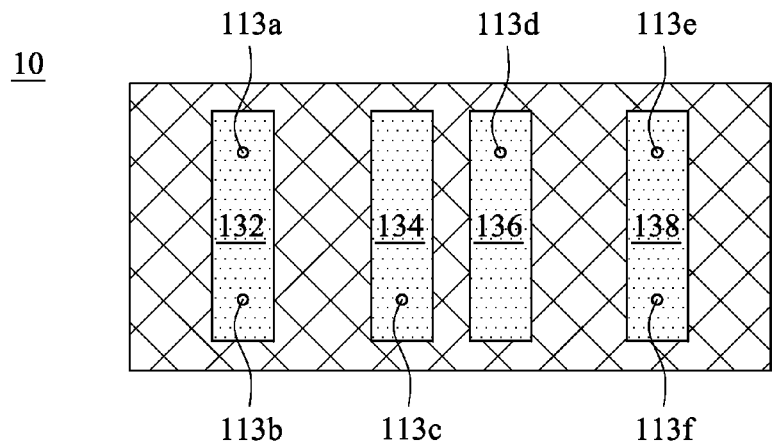

Reference is made to FIGS. 6 and 12. A plurality of channel rods 113a-113f are formed on the first active block 132, the second active block 134, the third active block 136, and the fourth active block 138. In greater detail, the channel rods 113a and 113b are formed on the first active block 132, the channel rod 113c is formed on the second active block 134, the channel rod 113d is formed on the third active block 136, and the channel rods 113e and 113f are formed on the fourth active block 138. The channel rods 113a, 113b, 113c, 113*d*, 113*e*, and 113*f* respectively serve as channels of the first transistor PG-1, the second transistor PD-1, the third transistor PU-1, the fourth transistor PU-2, the fifth transistor PD-2, and the sixth transistor PG-2 (see FIG. 11). The channel rods 113*a*~113*f* may be performed using epitaxy and polishing process. The channel rods 113*a*~113*f* may be made from silicon, Ge, SiGe, SiC, SiP, SiPC, SiGe with B11 doped, III-V material on the insulator, or any combination thereof. The III-V materials include InP, InAs, GaAs, AllnAs, InGaP, InGaAs, GaAsSb, GaPN, AlPN, or any combination thereof. The channel rods 113*a*, 113*b*, 113*e*, and 113*f* may be performed an n-doping process with dopants including B11, BF2, In, Ge, N, C, or any combination thereof, and the doping dose ranging from about 1e12~5e13. The channel rods 113*c* and 113*d* may be performed a p-doping process with dopants including P, As, Sb, Ge, N, C, or any combination thereof, and the doping dose ranging from about 1e12~5e13.

Figure 7:
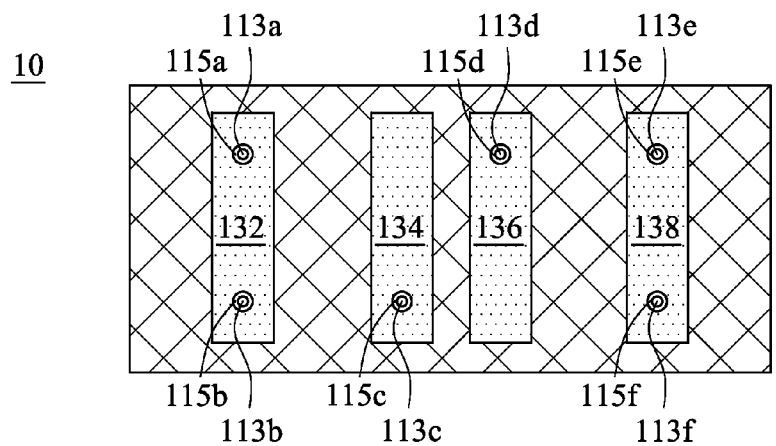

Reference is made to FIGS. 7 and 12. A plurality of gate insulators 115*a*~115*f* are formed to respectively surround the channel rods 113*a*~113*f*. The gate insulators 115*a*~115*f* may be performed using epitaxy process, and may be made from $SiO_2$, SiON, $Si_3O_4$, $Ta_2O_5$, $Al_2O_3$, PEOX, TEOS, nitrogen content oxide, nitrided oxide, Hf content oxide, Ta content oxide, Al content oxide, high-k materials (k>10), or any combination thereof.

Figure 8:
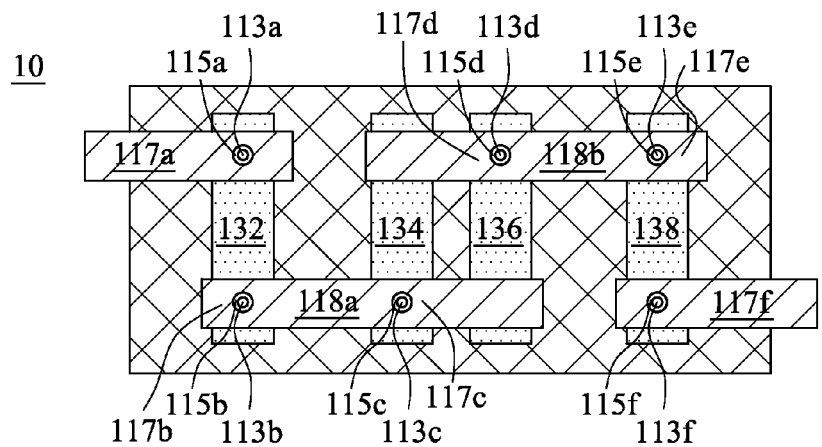

Reference is made to FIGS. 8 and 12. A plurality of gates 117*a*, 117*f* and gate plates (a first gate plate 118*a* and a second gate plate 118*b*) are formed to surround the channel rod 113*a*~113*f* and the gate insulators 115*a*~115*f*. In greater detail, the gate 117*a* surrounds the channel rod 113*a* to be the gate 117*a* of the first transistor PG-1 (see FIG. 11), and the gate 117*a* overlaps the first active block 132. The first gate plate 118*a* surrounds the channel rods 113*b*, 113*c* and the gate insulators 115*b*, 115*c*. Two portions of the first gate plate 118*a* respectively serve as gates 117*b*, 117*c* of the second transistor PD-1 and the third transistor PU-1 (see FIG. 11). The first gate plate 118*a* overlaps the first active block 132, the second active block 134, and the third active block 136. The second gate plate 118*b* surrounds the channel rods 113*d*, 113*e* and the gate insulators 115*d*, 115*e*. Two portions of the second gate plate 118*b* respectively serve as gates 117*d*, 117*e* of the fourth transistor PU-2 and the fifth transistor PD-2 (see FIG. 11). The second gate plate 118*b* overlaps the second active block 134, the third active block 136, and the fourth active block 138. The gate 117*f* surrounds the channel rod 113*f* and the gate insulator 115*f* to be the gate 117*f* of the sixth transistor PG-2 (see FIG. 11), and the gate 117*f* overlaps the fourth active block 138. The gates 117*a*, 117*f*, the first gate plate 118*a*, and the second gate plate 118*b* may be performed using deposition and etching process, and may be made from poly-Si with silicide, Al, Cu, W, Ti, Ta, N, refractory material (TiN, TaN, TiW, TiAl), or any combination thereof.

Figure 9:
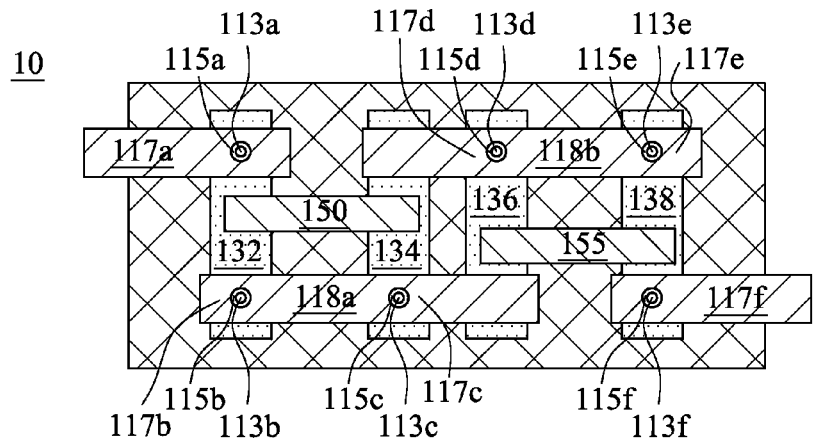

Reference is made to FIGS. 9 and 12. A first storage node 150 is formed to be electrically connected to the first active block 132 and the second active block 134, and a second storage node 155 is formed to be electrically connected to the third active block 136 and the fourth active block 138. The first storage node 150 and the second storage node 155 may be performed using deposition and etching process, and may be made from Al, Cu, W, Ti, Ta, Co, Pt, Ni, refractory material (TiN, TaN, TiW, TiAl), or any combination thereof.

Figure 10:
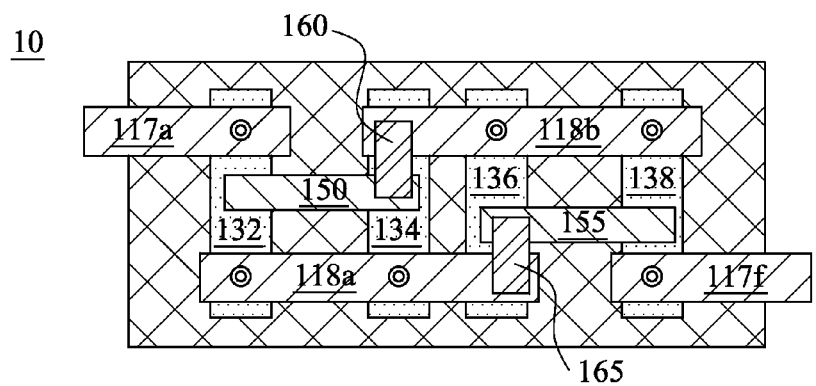

Reference is made to FIGS. 10 and 12. A first connection structure 160 can be formed to be electrically connected to the first storage node 150 and the second gate plate 118*b*, and a second connection structure 165 can be formed to be electrically connected to the second storage node 155 and the first gate plate 118*a*. The first connection structure 160 and the second connection structure 165 may be performed using deposition and etching process, and may be made from Al, Cu, W, Ti, Ta, Co, Pt, Ni, refractory material (TiN, TaN, TiW, TiAl), or any combination thereof.

Figure 11:
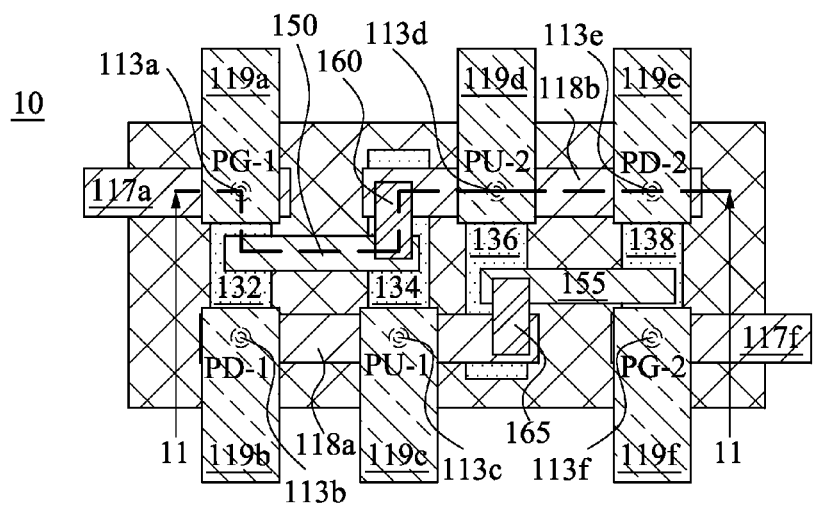
Figure 12:
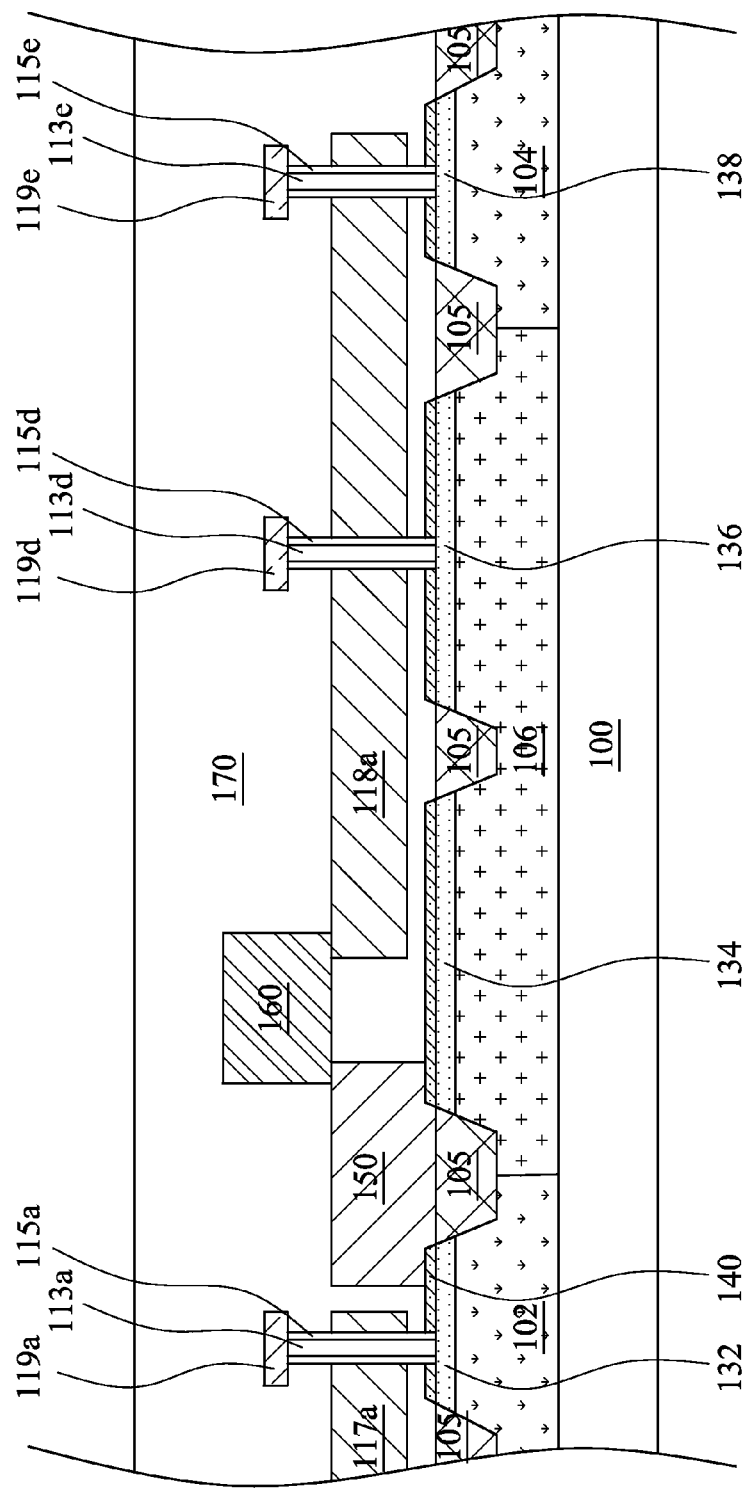
FIG. 12 is a cross-sectional view taken along line 12-12 of FIG. 11.

Reference is made to FIGS. 11 and 12. A plurality of top electrodes 119*a*~119*f* are respectively formed on the channel rods 113*a*~113*f*. In greater detail, the top electrode 119*a* is connected to the channel rod 113*a* to be a source of the first transistor PG-1, the top electrode 119*b* is connected to the channel rod 113*b* to be a source of the second transistor PD-1, the top electrode 119*c* is connected to the channel rod 113*c* to be a source of the third transistor PU-1, the top electrode 119*d* is connected to the channel rod 113*d* to be a source of the fourth transistor PU-2, the top electrode 119*e* is connected to the channel rod 113*e* to be a source of the fifth transistor PD-2, and the top electrode 119*f* is connected to the channel rod 113*f* to be a source of the sixth transistor PG-2. The top electrodes 119*a*~119*f* may be performed using epitaxy process, and may be made from Si-based materials.

Reference is made to FIG. 11. From the structural point of view, the first transistor PG-1 includes the bottom electrode 111*a* (see FIG. 5), the top electrode 119*a*, the channel rod 113*a*, the gate insulator 115*a* (see FIG. 9), and the gate 117*a* (see FIG. 9). The bottom electrode 111*a* is formed by a portion of the first active block 132 serving as the drain of the first transistor PG-1. The channel rod 113*a* is disposed between the bottom electrode 111*a* and the top electrode 119*a* and connected to the bottom electrode 111*a* and the top electrode 119*a*. The gate insulator 115*a* surrounds the channel rod 113*a*. The gate 117*a* surrounds the gate insulator 115*a*.

The second transistor PD-1 includes the bottom electrode 111*b* (see FIG. 5), the top electrode 119*b*, the channel rod 113*b*, the gate insulator 115*b* (see FIG. 9), and the gate 117*b* (see FIG. 9). The bottom electrode 111*b* is formed by another portion of the first active block 132 serving as the drain of the second transistor PD-1. The channel rod 113*b* is disposed between the bottom electrode 111*b* and the top electrode 119*b* and connected to the bottom electrode 111*b* and the top electrode 119*b*. The gate insulator 115*b* surrounds the channel rod 113*b*. The gate 117*b*, which is formed by a portion of the first gate plate 118*a*, surrounds the gate insulator 115*b*.

The third transistor PU-1 includes the bottom electrode 111*c* (see FIG. 5), the top electrode 119*c*, the channel rod 113*c*, the gate insulator 115*c* (see FIG. 9), and the gate 117*c* (see FIG. 9). The bottom electrode 111*c* is formed by a portion of the second active block 134 serving as the drain of the third transistor PU-1. The channel rod 113*c* is disposed between the bottom electrode 111*c* and the top electrode 119*c* and connected to the bottom electrode 111*c* and the top electrode 119*c*. The gate insulator 115*c* surrounds the channel rod 113*c*. The gate 117*c*, which is formed by another portion of the first gate plate 118*a*, surrounds the gate insulator 115*c*.

The fourth transistor PU-2 includes the bottom electrode 111*d* (see FIG. 5), the top electrode 119*d*, the channel rod 113*d*, the gate insulator 115*d* (see FIG. 9), and the gate 117*d* (see FIG. 9). The bottom electrode 111*d* is formed by a portion of the third active block 136 serving as the drain of the fourth transistor PU-2. The channel rod 113*d* is disposed between the bottom electrode 111*d* and the top electrode 119*d* and connected to the bottom electrode 111*d* and the top electrode 119*d*. The gate insulator 115*d* surrounds the channel rod 113*d*. The gate 117*d*, which is formed by a portion of the second gate plate 118*b*, surrounds the gate insulator 115*d*.

The fifth transistor PD-2 includes the bottom electrode 111*e* (see FIG. 5), the top electrode 119*e*, the channel rod 113*e*, the gate insulator 115*e* (see FIG. 9), and the gate 117*e* (see FIG. 9). The bottom electrode 111*e* is formed by a portion of the fourth active block 138 serving as the drain of the fifth transistor PD-2. The channel rod 113*e* is disposed between the bottom electrode 111*e* and the top electrode 119*e* and connected to the bottom electrode 111*e* and the top electrode 119*e*. The gate insulator 115*e* surrounds the channel rod 113*e*. The gate 117*e*, which is formed by another portion of the second gate plate 118*b*, surrounds the gate insulator 115*e*.

The sixth transistor PG-2 includes the bottom electrode 111*f* (see FIG. 5), the top electrode 119*f*, the channel rod 113*f*, the gate insulator 115*f* (see FIG. 9), and the gate 117*f*. The bottom electrode 111*f* is formed by another portion of the fourth active block 138 serving as the drain of the sixth transistor PG-2. The channel rod 113*f* is disposed between the bottom electrode 111*f* and the top electrode 119*f* and connected to the bottom electrode 111*f* and the top electrode 119*f*. The gate insulator 115*f* surrounds the channel rod 113*f*. The gate 117*f* surrounds the gate insulator 115*f*.

In the FIG. 11, the first active block 132 serves as the connection structure between the drain of the first transistor PG-1 and the drain of the second transistor PD-1. The fourth active block 138 serves as the connection structure between the drain of the fifth transistor PD-2 and the drain of the sixth transistor PG-2. The first gate plate 118*a* serves as a connection structure between the gate 117*b* (see FIG. 9) of the second transistor PD-1 and the gate 117*c* (see FIG. 9) of the third transistor PU-1. The second gate plate 118*b* serves as a connection structure between the gate 117*d* (see FIG. 9) of the fourth transistor PU-2 and the gate 117*e* (see FIG. 9) of the fifth transistor PD-2. In this way, other contacts can be reduced or omitted, resulting in a small layout area and simple manufacturing process of the memory cell 10. Moreover, the first storage node 150 and the first connection structure 160 together interconnect the first active block 132, the second active block 134, and the second gate plate 118*b*. The second storage node 155 and the second connection structure 165 together interconnect the third active block 136, the fourth active block 138, and the first gate plate 118*a*.

Figure 22:
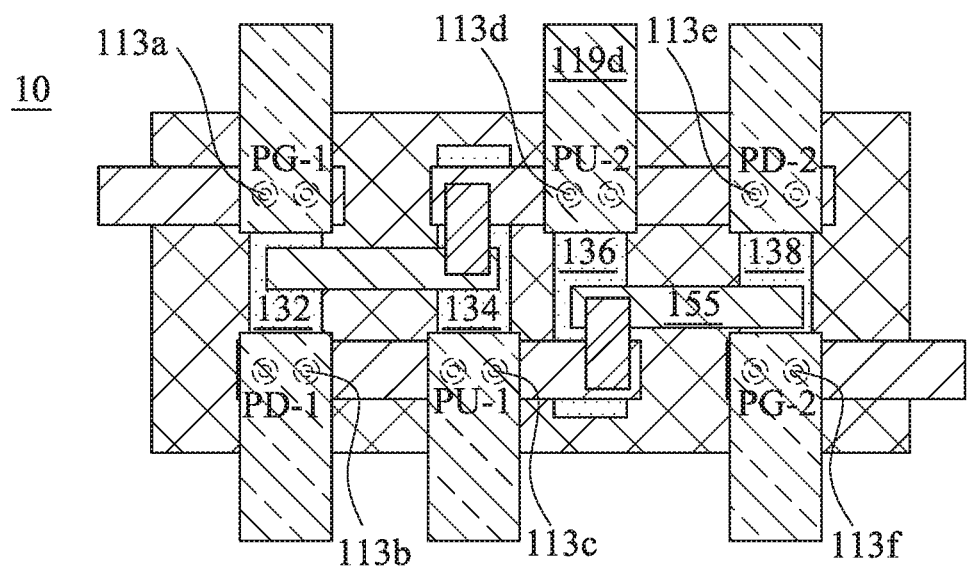
FIG. 22 is a plane view of a memory cell 10 in accordance with various embodiments of the present disclosure.

It is noted that although in FIG. 11, the transistors (PG-1, PD-1, PU-1, PU-2, PD-2, and PG-2) respectively have single channel rod, the claimed scope of the present disclosure is not limited in this respect. In various embodiments, at least one of the transistors has a plurality of the channel rods, as shown in FIG. 22.

As shown in FIG. 12, a first dielectric layer 170 is formed above the first wells 102, 104, and the second well 106, and covers the transistors (the first transistor PG-1 to the sixth transistors PG-2 (see FIG. 11)). For the sake of clarity, the first dielectric layer 170 is depicted in the cross-sectional view and is omitted in the plane view.

Figure 13:
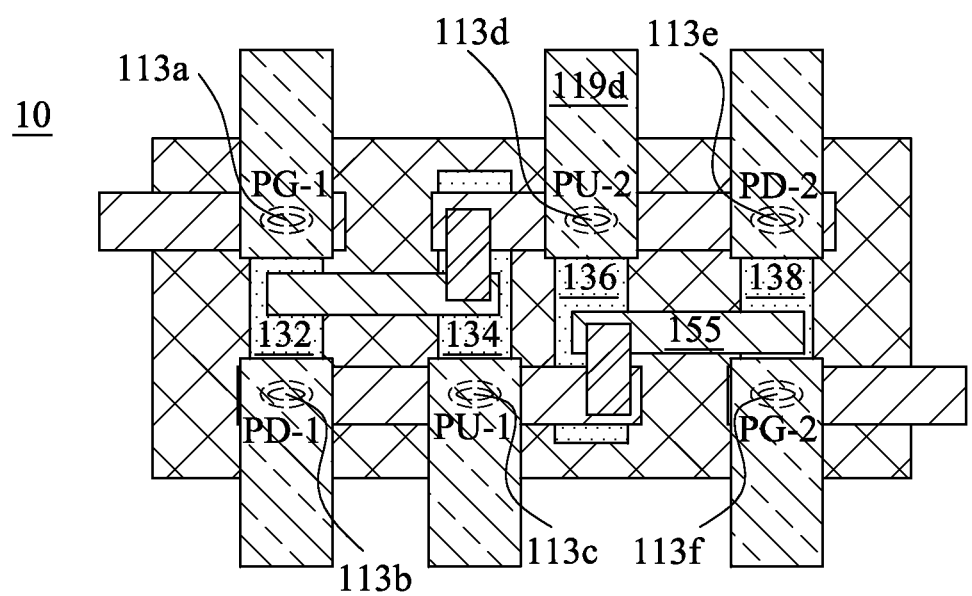
FIG. 13 is a plane view of a memory cell 10 in accordance with various embodiments of the present disclosure.

In FIG. 11, the plane views of the channel rods 113*a*~113*f* are circular in shape, but the claimed scope of the present disclosure is not limited in this respect. FIG. 13 is a plane view of a memory cell 10 in accordance with various embodiments of the present disclosure. In FIG. 13, the plane views of the channel rods 113*a*~113*f* are oval-shaped. Other relevant structural details of the memory cell 10 in FIG. 13 are the same as that in FIG. 11, and, therefore, a description in this regard will not be repeated hereinafter.

Figure 14:
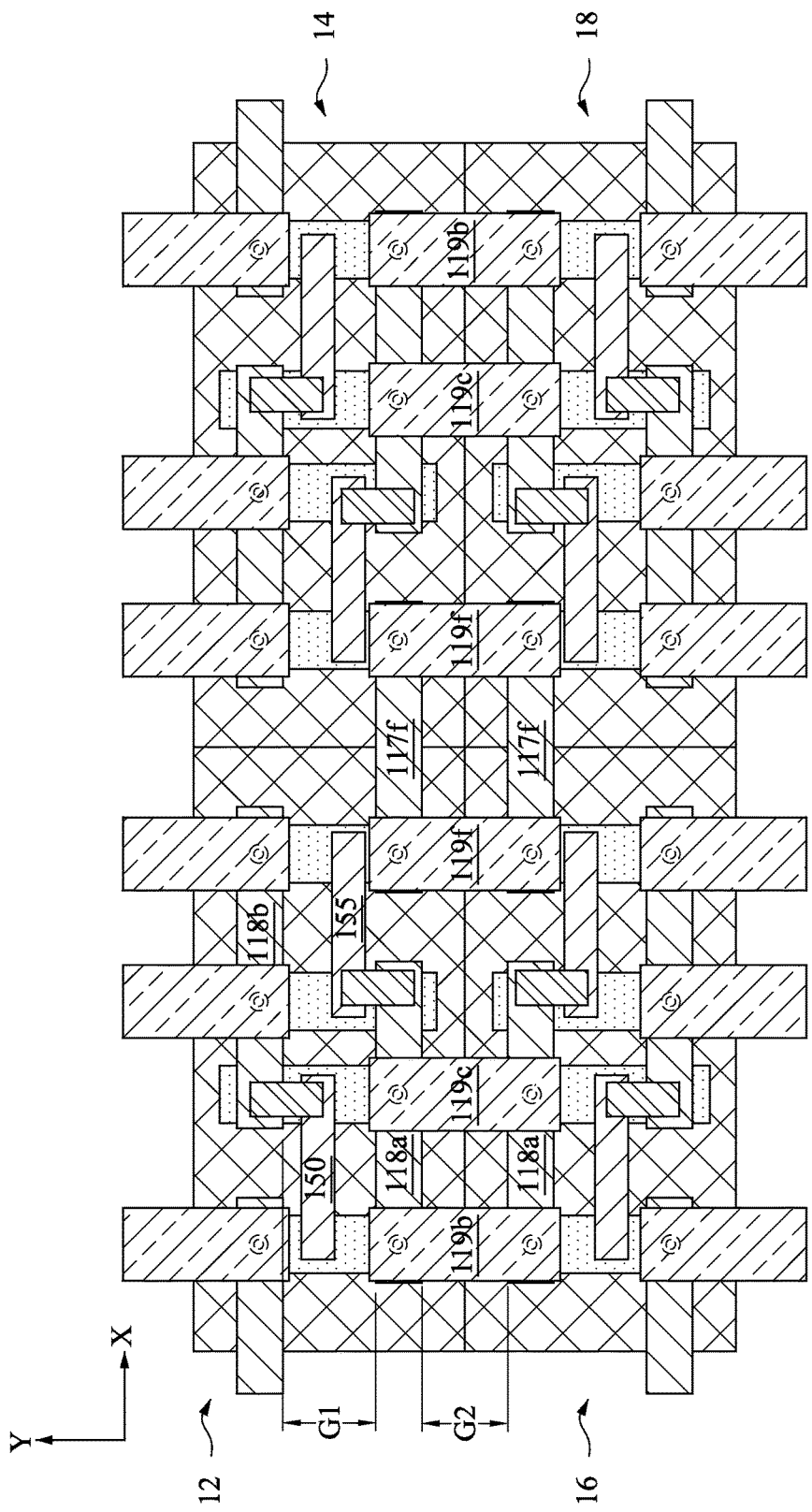
FIG. 14 a plane view of a memory device including the memory cell of FIG. 11 in accordance with various embodiments of the present disclosure.

FIG. 14 a plane view of a memory device including the memory cell of FIG. 11 in accordance with various embodiments of the present disclosure. The memory device includes memory cells 12, 14, 16, and 18. All of the memory cells 12, 14, 16, and 18 have an identical structure as the memory cell 10 of FIG. 11 but different orientations. In greater detail, the memory cells 12 and 14 are symmetric with relative to the illustrated Y axis, and the memory cells 16 and 18 are symmetric with relative to the illustrated Y axis. The memory cells 12 and 16 are symmetric with relative to the illustrated X axis, and the memory cells 14 and 18 are symmetric with relative to the illustrated X axis. The memory cells 12, 14, 16, and 18 as a group may be reproduced and allocated as a plurality of rows and columns to form a memory cell array.

In FIG. 14, the top electrodes 119*b* in adjacent two of the memory cells (such as the memory cells 12 and 16) can be integrally formed, the top electrodes 119*c* in adjacent two of the memory cells (such as the memory cells 12 and 16) can be integrally formed, the top electrodes 119*f* in adjacent two of the memory cells (such as the memory cells 12 and 16) can be integrally formed, and the gates 117*f* in adjacent two of the memory cells (such as the memory cells 12 and 14) can be integrally formed. However, the claimed scope of the present disclosure is not limited in this respect.

In various embodiments, the first storage node 150 in the memory cell 12 is partially disposed between the first gate plate 118*a* and the second gate plate 118*b*, and the second storage node 155 is partially disposed between the first gate plate 118*a* and the second gate plate 118*b*. A first gap G1 is formed between the first gate plate 118*a* and the second gate plate 118*b*, and a second gap G2 is formed between two of the first gate plates 118*a* respectively disposed in adjacent two of the memory cells (such as the memory cells 12 and 16). The first gap G1 has a distance longer than the second gap G2.

In greater detail, since there is no connection structure between the adjacent two memory cells 12 and 16 (or between the two first gate plates 118*a*), the second gap G2 can be smaller than the first gap G1, thereby the layout area is reduced. In various embodiments, (G1/G2)>30, and the claimed scope of the present disclosure is not limited in this respect.

Figure 15:
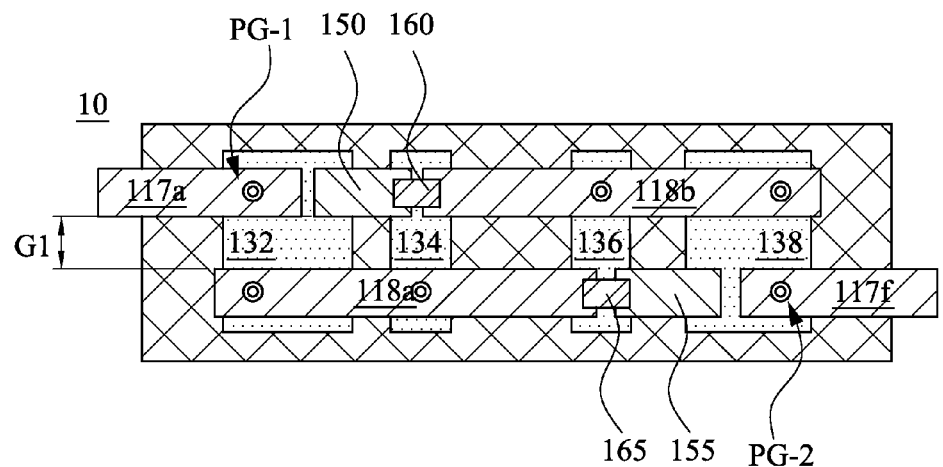
FIG. 15 is a plane view of a memory cell in accordance with various embodiments of the present disclosure.

FIG. 15 is a plane view of a memory cell 10 in accordance with various embodiments of the present disclosure. For the sake of clarity, the top electrodes 119*a*~119*f* (see FIG. 11) are omitted in FIG. 14. The difference between FIG. 15 and FIG. 11 pertains to the positions of the first storage node 150 and the second storage node 155. In FIG. 15, the first storage node 150 is disposed between the second gate plate 118*b* and the gate 117*a* of the first transistor PG-1, and the second storage node 155 is disposed between the first gate plate 118*a* and the gate 117*f* of the sixth transistor PG-2. In this way, since there is no connection structure (i.e., the first storage node 150 and the second storage node 155) between the first gate plate 118*a* and the second gate plate 118*b*, the distance of the first gap G1 can be reduced. Hence, the layout area in FIG. 15 is smaller than that in FIG. 11. Other relevant structural details of the memory cell 10 in FIG. 15 are all the same as that in FIG. 11, and, therefore, a description in this regard will not be repeated hereinafter.

Figure 16:
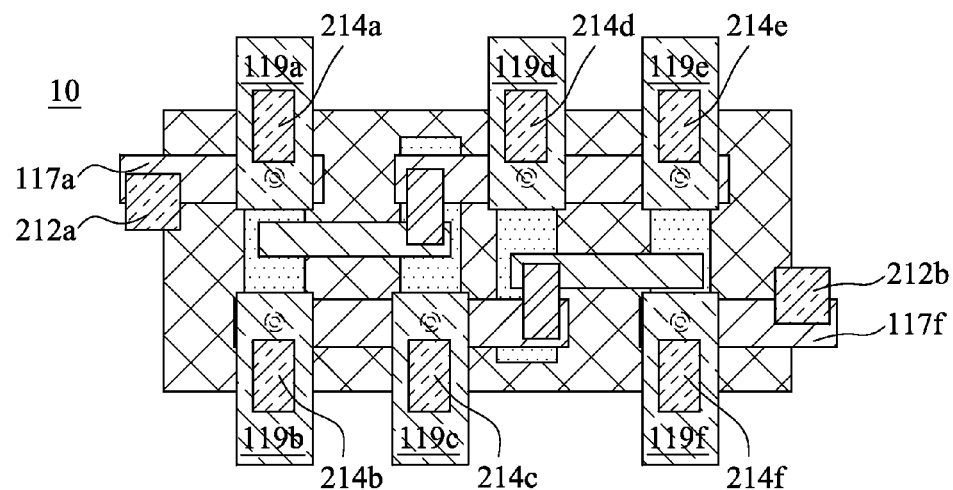
FIGS. 16~18 are plane views of a method for manufacturing a memory cell according to various embodiments of the present disclosure.
Figure 17:
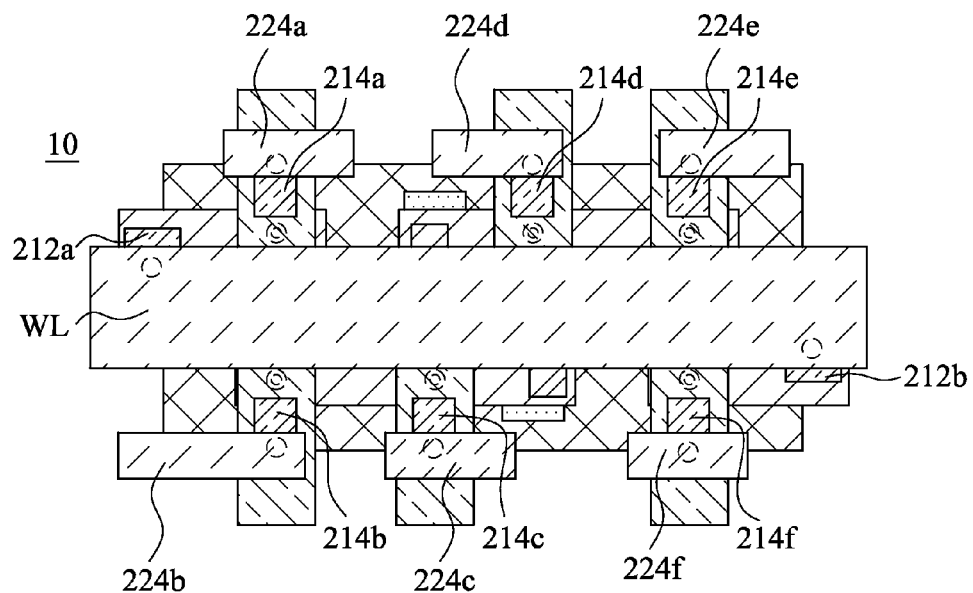
Figure 18:
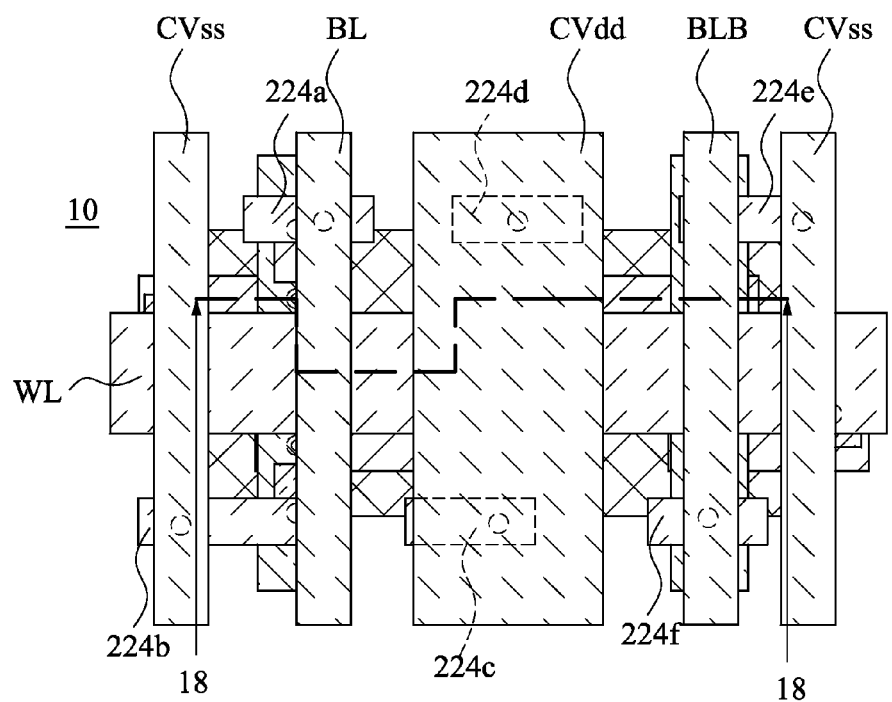
Figure 19:
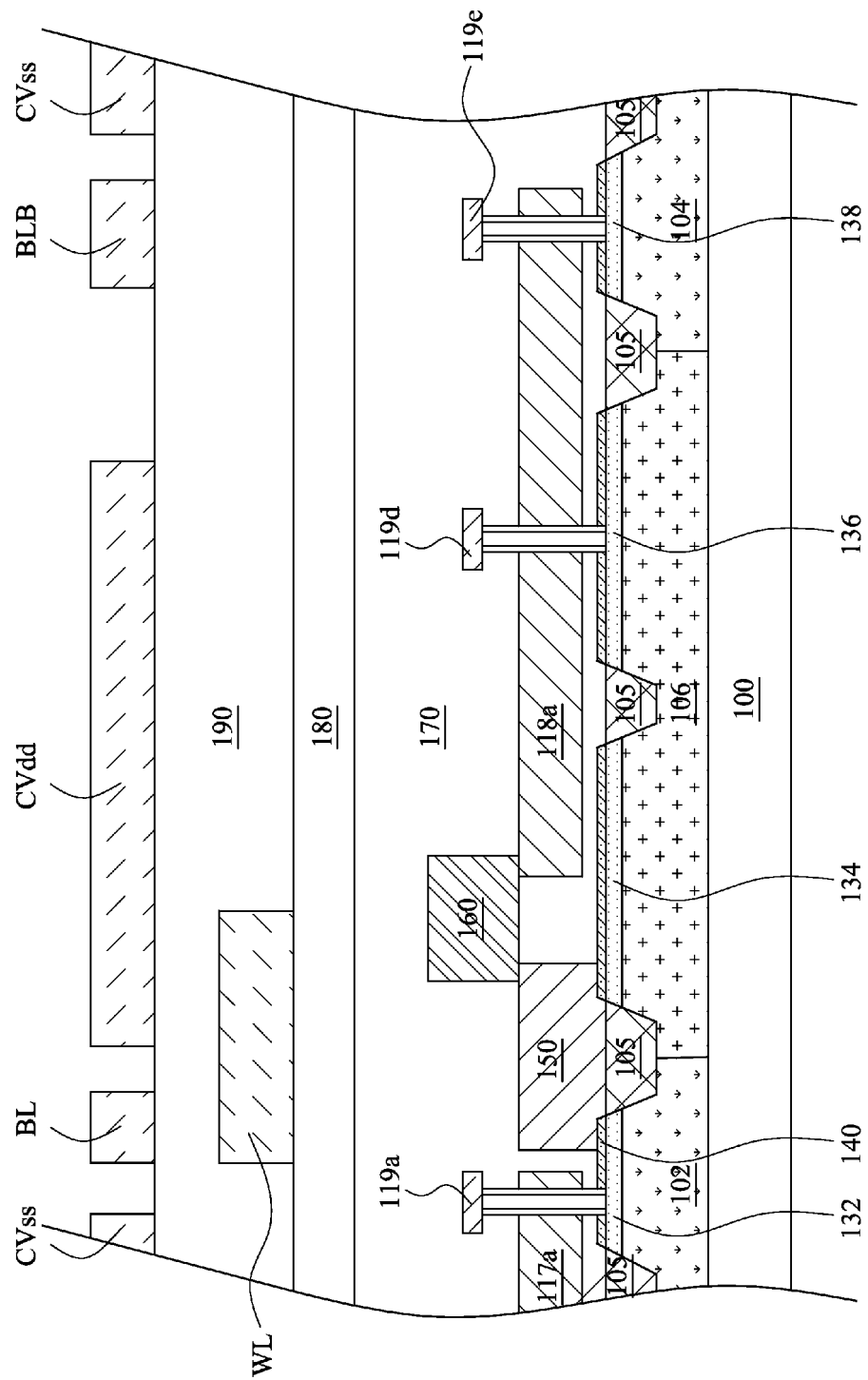
FIG. 19 is a cross-sectional view taken along line 19-19 of FIG. 18.

In various embodiments, the transistors in the memory cells can be electrically connected to external conductors. FIGS. 16~18 are plane views of a method for manufacturing the memory cell according to various embodiments of the present disclosure, and FIG. 19 is a cross-sectional view taken along line 19-19 of FIG. 18. The manufacturing processes of FIGS. 3~11 are performed before the process of FIG. 16 is started. Reference is then made to FIGS. 16 and 19. A plurality of gate contacts 212a and 212b are respectively formed on the gate 117a and 117f. Then, a plurality of top electrode contacts 214a~214f are respectively formed on the top electrodes 119a~119f. The gate contacts 212a and 212b and the top electrode contacts 214a~214f may be performed using deposition and etching process, and may be made from Al, Cu, W, Ti, Ta, Co, Pt, Ni, refractory material (TiN, TaN, TiW, TiAl), or any combination thereof.

Reference is made to FIGS. 17 and 19. A second dielectric layer 180 is formed on the first dielectric layer 170. For the sake of clarity, the second dielectric layer 180 is depicted in the cross-sectional view and is omitted in the plane view. Subsequently, a plurality of contacts 224a~224f are partially formed in the second dielectric layer 180 and a word line WL is formed on the second dielectric layer 180. The contacts 224a~224f are respectively formed on and electrically connected to the top electrode contacts 214a~214f through plugs which are shown as circles indicated with the dashed lines in the contacts 224a~224f, and the word line WL is electrically connected to the gate contacts 212a and 212b through plugs which are shown as circles indicated with the dashed lines in the word line WL. For example, a plurality of openings can be formed in the second dielectric layer 180 to respectively expose portions of the gate contacts 212a and 212b, and the contacts 224a~224f, and a conductive layer is formed on the second dielectric layer 180 and fills in all of the openings to form the plugs mentioned above. Then the conductive layer is patterned to be the word line WL and the contacts 224a~224f. The word line WL and the contacts 224a~224f may be made from Al, Cu, W, Ti, Ta, Co, Pt, Ni, refractory material (TiN, TaN, TiW, TiAl), or any combination thereof.

Reference is made to FIGS. 18 and 19. A third dielectric layer 190 is formed on the second dielectric layer 180 and covers the word line WL and the contacts 224a-224f. For the sake of clarity, the third dielectric layer 190 is depicted in the cross-sectional view and is omitted in the plane view. A first bit line BL, a second bit line BLB, and a plurality of power supply conductors CVss and CVdd are formed on the third dielectric layer 190. For example, a plurality of openings can be formed in the third dielectric layer 190 to respectively expose portions of the contacts 224a~224f, and another conductive layer is formed on the third dielectric layer 190 and fills in all of the openings to form plugs. Then the conductive layer is patterned to be the first bit line BL, the second bit line BLB, and the power supply conductors CVss and CVdd. In greater detail, the first bit line BL is electrically connected to the contact 224a through the plug which is shown as a circle indicated with the dashed lines in the first bit line BL. That is, the first bit line BL is electrically connected to the source of the first transistor PG-1 (see FIG. 11). The second bit line BLB is electrically connected to the contact 224f through the plug which is shown as a circle indicated with the dashed lines in the second bit line BLB. That is, the second bit line BLB is electrically connected to the source of the sixth transistor PG-2 (see FIG. 11). The power supply conductors CVss are respectively electrically connected to the contacts 224b and 224e through the plugs which are shown as circles indicated with the dashed lines in the power supply conductors CVss. That is, the power supply conductors CVss are electrically connected to the source of the second transistor PD-1 (see FIG. 11) and the source of the fifth transistor PD-2 (see FIG. 11). The power supply conductor CVdd is electrically connected to the contacts 224c and 224d through the plugs which are shown as circles indicated with the dashed lines in the power supply conductor CVdd. That is, the power supply conductor CVdd is electrically connected to the source of the third transistor PU-1 (see FIG. 11) and the source of the fourth transistor PU-2 (see FIG. 11). The first bit line BL, the second bit line BLB, and the power supply conductors CVss and CVdd may be made from Al, Cu, W, Ti, Ta, Co, Pt, Ni, refractory material (TiN, TaN, TiW, TiAl), or any combination thereof. In various embodiments, the power supply conductors CVss in adjacent two of the memory cells 10 can be combined to be a single power supply conductors CVss, and the claimed scope of the present disclosure is not limited in this respect.

Figure 20:
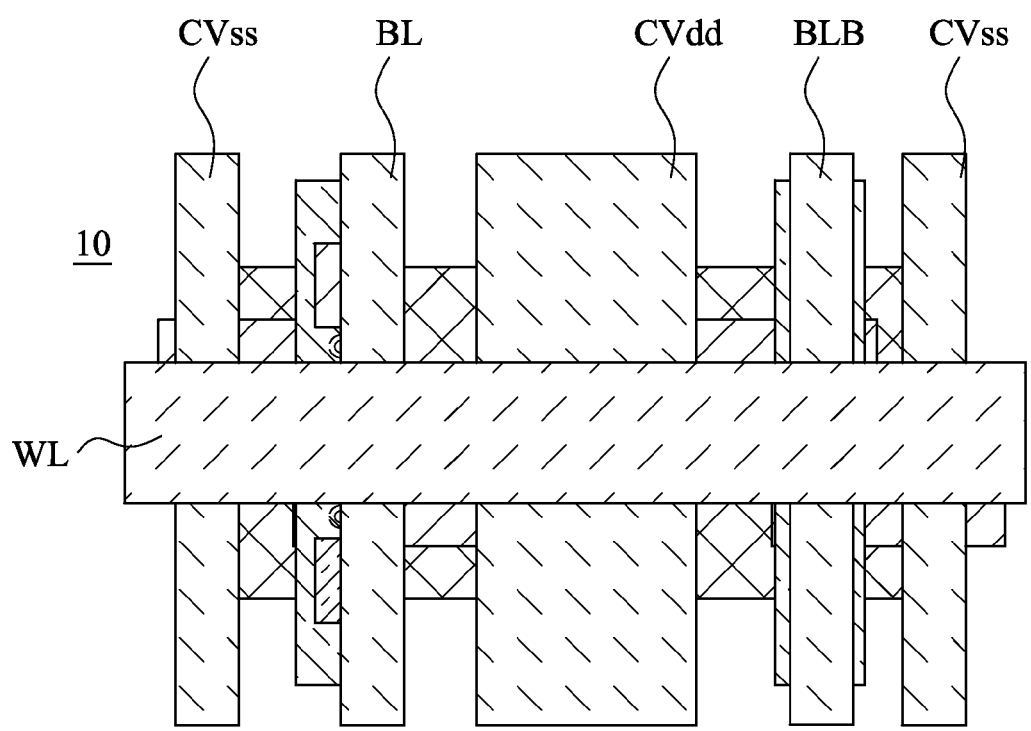
FIG. 20 is a plane view of a memory cell in accordance with various embodiments of the present disclosure.

However, the routing of the word line WL, the first bit line BL, the second bit line BLB, and the power supply conductors CVss and CVdd are not limited in the configuration of FIG. 18. FIG. 20 is a plane view of a memory cell in accordance with various embodiments of the present disclosure. In FIG. 20, the word line WL is disposed above the first bit line BL, the second bit line BLB, and the power supply conductors CVss and CVdd. For the sake of clarify, the vias connected to the word line WL, the first bit line BL, the second bit line BLB, and the power supply conductors CVss and CVdd are omitted in FIG. 20. Other relevant structural details of the memory cell in FIG. 20 are all the same as that in FIG. 18, and, therefore, a description in this regard will not be repeated hereinafter.

Figure 21A:
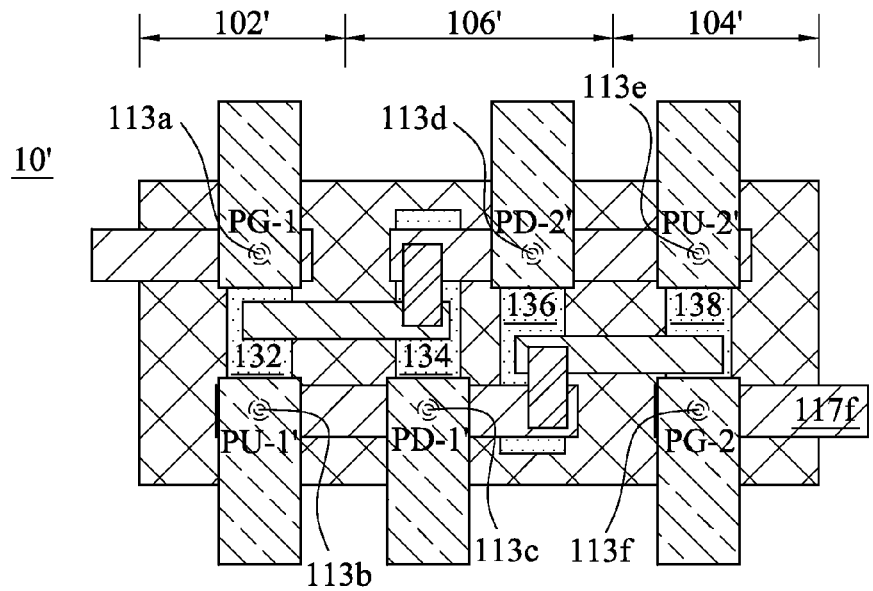
FIG. 21A is a plane view of a memory cell in accordance with various embodiments of the present disclosure.
Figure 21B:
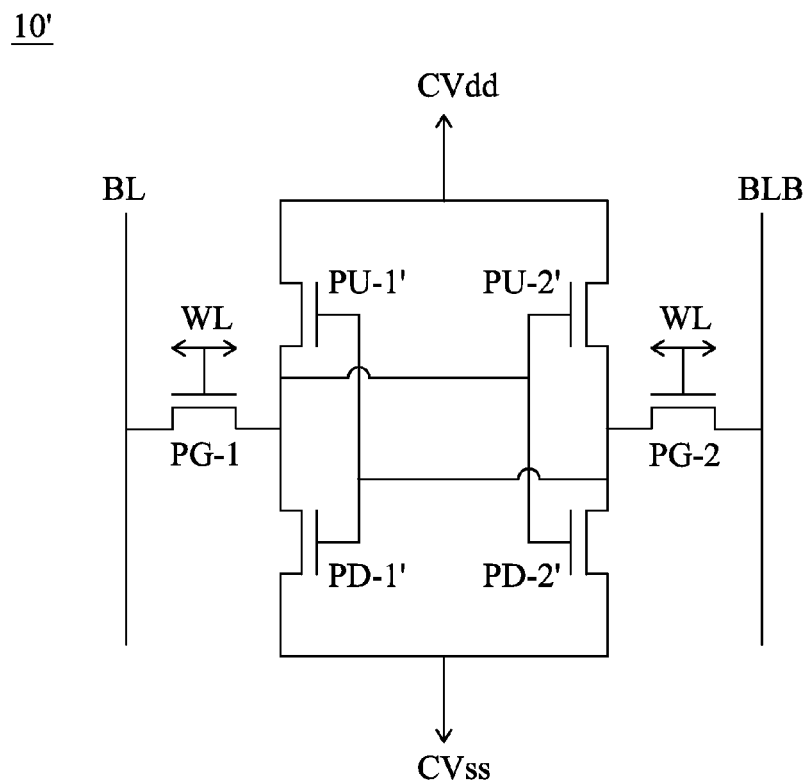
FIG. 21B is a circuit diagram of the memory cell of FIG. 21A.

FIG. 21A is a plane view of a memory cell in accordance with various embodiments of the present disclosure, and FIG. 21B is a circuit diagram of the memory cell 10' of FIG. 21A. For the sake of clarity, the word line WL, the first bit lines BL, the second bit line BLB, and the power supply conductors CVdd, CVss are depicted in the circuit diagram and not in the plane view. The difference between FIGS. 21A, 21B and FIGS. 2A, 2B pertains to the type of the memory cell. In FIGS. 21A and 21B, the memory cell 10' is a P-type pass gate device. That is, the first wells 102' and 104' are N-type wells, and the second well 106' is a P-type well. The first transistor PG-1 and the sixth transistor PG-2 are pass-gate transistors, the second transistor PU-1' and the fifth transistor PU-2' are pull-up transistors, and the third transistor PD-1' and the fourth transistor PD-2' are pull-down transistors. The first bit line BL is electrically connected to the first transistor PG-1, the second bit line BLB is electrically connected to the sixth transistor PG-2, the power supply conductor CVss is electrically connected to the third transistor PD-1' and the fourth transistor PD-2', and the power supply conductor CVdd is electrically connected to the second transistor PU-1' and the fifth transistor PU-2'. The channel rods 113a, 113b, 113e, and 113f may be performed a p-doping process, and the channel rods 113c and 113d may be performed an n-doping process. The first active block 132 and the fourth active block 138 may be made from SiGe, Ge, SiP, SiC, III-V materials, or any combination thereof. The second active block 134 and the third active block 136 may be made from SiP, SiC, Si, Ge, III-V materials, or any combination thereof. The III-V materials include InP, InAs, GaAs, AlInAs, InGaP, InGaAs, GaAsSb, GaPN, AlPN, or any combination thereof. Other relevant structural details of the memory cell in FIGS. 21A and 21B are all the same as that in FIGS. 2A and 2B, and, therefore, a description in this regard will not be repeated hereinafter.

In various embodiment of the present disclosure, the transistors of the memory cells are vertical-gate-all-around (VGAA) configurations, which provide high integration densities. The gate of the (VGAA) transistors surrounds its channel region on all sides, thereby improving its ability to control the flow of current and exhibiting good short channel control. In addition, the active blocks can be connection structures between the transistors in at least one of the memory cells. Therefore, the contacts that connecting the transistors can be reduced or omitted, resulting a dense integration layout. Furthermore, the top electrodes of the second, the third, the fourth, and the fifth transistors has lower contact resistance for speed improvement, and the top electrodes of the first and the sixth transistors, which are respectively connected to the first and the second bit lines, have lower bit line capacitance.

In various embodiments, a memory cell includes an array of memory cells. At least one of the memory cells includes a plurality of transistors with vertical-gate-all-around configurations and a plurality of active blocks. A portion of one of the active blocks serving as a source or a drain of one of the transistors. The active blocks in any adjacent two of the memory cells are isolated from each other.

In various embodiments, a memory cell includes an array of memory cells. At least one of the memory cells includes a plurality of transistors with vertical-gate-all-around configurations and a plurality of active blocks. A portion of one of the active blocks serves as a source or a drain of one of the transistors. The active blocks in one of the memory cells are distant from boundaries of the memory cell.

In various embodiments, a method for manufacturing a memory device includes forming an array of memory cells on or above a substrate. Forming at least one of the memory cells includes forming a plurality of active blocks on or above the substrate, and the active blocks in any adjacent two of the memory cells are isolated from each other. A plurality of transistors with vertical-gate-all-around configurations are formed on or above the substrate. A portion of at least one of the active blocks serves as a source or a drain of one of the transistors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
   an array of memory cells, at least one of the memory cells comprising:
   a plurality of transistors with vertical-gate-all-around configurations;
   a plurality of active blocks, a portion of one of the active blocks serving as a source or a drain of one of the transistors, wherein the active blocks in any adjacent two of the memory cells are isolated from each other;
   a first gate plate serving as a gate of a first transistor of the plurality of the transistors; and
   a storage node coupled to first and second active blocks of the plurality of the active blocks and having a top surface flush with a top surface of the first gate plate.

2. The memory device of claim 1, wherein the active blocks further comprise a third active block and a fourth active block; the memory device further comprising a first bit line and a second bit line,
   wherein the transistors of the at least one of the memory cells comprise:
   the first transistor, a bottom electrode of the first transistor being a portion of the third active block;
   a second transistor;
   a third transistor, a gate of the second transistor and a gate of the third transistor forming a second gate plate, and a bottom electrode of the third transistor being a portion of the second active block;
   a fourth transistor electrically connected to a word line and the first bit line, a bottom electrode of the second transistor and a bottom electrode of the fourth transistor forming the first active block;
   a fifth transistor, a gate of the fourth first transistor and a gate of the fifth transistor forming the first gate plate; and
   a sixth transistor electrically connected to the word line and the second bit line, a bottom electrode of the fifth transistor and a bottom electrode of the sixth transistor forming the fourth active block.

3. The memory device of claim 2, further comprising at least one CVdd line, wherein a top electrode of the second transistor and a top electrode of the fifth transistor are electrically connected to a CVss line, and a top electrode of the third transistor and a top electrode of the first transistor are electrically connected to the CVdd line; or the top electrode of the second transistor and the top electrode of the fifth transistor are electrically connected to the CVdd line, and the top electrode of the third transistor and the top electrode of the first transistor are electrically connected to the CVss line.

4. The memory device of claim 2, wherein the storage node is partially disposed between the first gate plate and the second gate plate.

5. The memory device of claim 4, wherein a first gap is formed between the first gate plate and the second gate plate, and a second gap is formed between two of the first gate plates respectively disposed in adjacent two of the memory cells, the first gap has a distance longer than the second gap.

6. The memory device of claim 2, wherein the storage node is disposed between the first gate plate and a gate of the fourth transistor.

7. The memory device of claim 2, wherein the at least one of the memory cells further comprises two first wells and a second well disposed between the two first wells, dopants of the first wells are different from dopants of the second well, the fourth transistor and the second transistor are disposed on one of the first wells, the third transistor and the first transistor are disposed on the second well, and the fifth transistor and the sixth transistor are disposed on the other of the first wells.

8. The memory device of claim 7, wherein the first wells are N-type wells, and the second well is a P-type well; or the first wells are P-type wells, and the second well is an N-type well.

9. The memory device of claim 1, further comprising:
   an isolation structure disposed between any adjacent two of the memory cells.

10. The memory device of claim 1, wherein the first and second active blocks are rectangular and have different widths.

11. A memory device comprising:
    an array of memory cells including upper and lower memory cells, at least one of the memory cells comprising:

a plurality of transistors with vertical-gate-all-around configurations; and a plurality of active blocks, a portion of one of the active blocks serving as a source or a drain of one of the transistors, wherein the active blocks in one of the memory cells are distant from a boundary of the one of the memory cells; and a plurality of gate plates serving as gates of the transistors and including first and second gate plates, wherein a first gap between the first and second gate plates of the upper memory cell is longer than a second gap between the first gate plate of the upper memory cell and the first gate plate of the lower memory cell.

12. The memory device of claim 11, wherein at least one of the memory cells is a six-transistor (6T) static random access memory (SRAM).

13. The memory device of claim 11, further comprising:
an isolation structure disposed at the boundary of the at least one of the memory cells.

14. The memory device of claim 11, further comprising:
at least one bit line electrically connected to a portion of the transistors.

15. The memory device of claim 11, further comprising:
a storage node coupled to first and second active blocks of the plurality of the active blocks; and
a connection structure having a bottom surface that interconnects the storage node and the second gate plate and that lies on a horizontal plane.

16. A method for manufacturing a memory device, comprising:

forming an array of memory cells on or above a substrate, wherein forming at least one of the memory cells comprises:
forming a plurality of active blocks on or above the substrate, and the active blocks in any adjacent two of the memory cells are isolated from each other;
forming a plurality of transistors with vertical-gate-all-around configurations on or above the substrate, wherein a portion of at least one of the active blocks serves as a first source/drain region of one of the transistors;
forming a storage node that interconnects two of the active blocks; and
forming a second source/drain region above the first source/drain region after forming the storage node.

17. The method of claim 16, further comprising:
forming an isolation structure between any adjacent two of the memory cells.

18. The method of claim 16, further comprising:
forming at least one bit line electrically connected to a portion of the transistors.

19. The method of claim 16, further comprising forming a connection structure that interconnects the storage node and a gate of one of the transistors, wherein forming the storage node and forming the connection structure are performed separately.

20. The method of claim 16, further comprising:
forming a connection structure that interconnects the storage node and a gate plate; and
forming the second source/drain region after forming the connection structure.

* * * * *